(12) United States Patent
Wang et al.

(10) Patent No.: US 6,358,840 B1
(45) Date of Patent: Mar. 19, 2002

(54) FORMING AND FILLING A RECESS IN INTERCONNECT WITH ALLOY TO MINIMIZE ELECTROMIGRATION

(75) Inventors: Pin-Chin C. Wang, Menlo Park; Christy M. Woo, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/655,699

(22) Filed: Sep. 6, 2000

(51) Int. Cl.$^7$ .......................................... H01L 21/4763
(52) U.S. Cl. ...................... 438/631; 438/684; 438/690; 438/694; 427/305; 427/355
(58) Field of Search ................................ 438/631, 689, 438/690, 694; 427/98, 305, 355, 427, 443.1

(56) References Cited

U.S. PATENT DOCUMENTS 5,891,513 A * 1/1996 Dubin et al. ................... 427/98
6,022,808 A * 3/1998 Nogami et al. ............. 438/694

\* cited by examiner

*Primary Examiner*—David Nelms
*Assistant Examiner*—Renee R. Berry
(74) *Attorney, Agent, or Firm*—Monica H. Choi

(57) ABSTRACT

In a method for filling an interconnect opening to form an interconnect of an integrated circuit, the interconnect opening is formed within an insulating layer. The interconnect opening is partially filled with a conductive material to form a recess within the conductive material toward a top of the interconnect opening, and the recess is disposed within the interconnect opening. An alloy is conformally deposited to fill the recess. Any conductive material and the alloy on the insulating layer are polished away such that the conductive material and the alloy are contained within the interconnect opening. A thermal anneal is then performed such that the conductive material and the alloy form into a conductive fill of a single grain structure within the interconnect opening. An additional encapsulating material is formed to cover a top surface of the conductive fill during the thermal anneal from the dopant of the alloy diffusing out of the alloy and along the top surface of the conductive fill. A bulk encapsulating layer is formed on top of the additional encapsulating material and on top of the insulating layer. The present invention may be used to particular advantage when the conductive material that partially fills the interconnect opening is copper, and when the alloy that fills the recess is a copper alloy with a dopant metal having a solid solubility in copper that is less than 0.1 atomic percent at room temperature and having a concentration in the copper alloy that is greater than the solid solubility in the copper alloy. In this manner, the additional encapsulating material on the top surface of the conductive fill prevents lateral drift of the conductive material comprising the conductive fill along a bottom surface of the bulk encapsulating layer.

17 Claims, 5 Drawing Sheets

FORMING AND FILLING A RECESS IN INTERCONNECT WITH ALLOY TO MINIMIZE ELECTROMIGRATION

TECHNICAL FIELD

The present invention relates generally to fabrication of integrated circuits, and more particularly, to forming a recess in an interconnect, such as copper interconnect for example, by partially filling an interconnect opening, and to filling the recess with an alloy to form an additional encapsulating material during a thermal anneal on top of the interconnect for preventing material comprising the interconnect from laterally drifting into surrounding insulating material.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and shorted metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a semiconductor substrate 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 is typically comprised of silicon dioxide. Copper may easily diffuse into the insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Referring to FIG. 1, in the prior art, the encapsulating layer 112 of silicon nitride is deposited directly onto an exposed surface of the copper interconnect 102 and the surrounding insulating layer 106 after the exposed surface of the copper interconnect 102 and the surrounding insulating layer 106 are polished to a level surface. Unfortunately, the silicon nitride of the encapsulating layer 112 does not bond well to the copper at the exposed surface of the copper interconnect 102. Thus, although copper does not diffuse easily through the encapsulating layer 112 of silicon nitride, copper from the copper interconnect 102 laterally drifts from the interface between the copper interconnect 102 and the encapsulating layer 112 of silicon nitride along the bottom surface 114 of the encapsulating layer 112 of silicon nitride because of the weak bonding of the copper interconnect 102 and the encapsulating layer 112 of silicon nitride.

The copper that laterally drifts from the interface between the copper interconnect 102 and the encapsulating layer 112 of silicon nitride along the bottom surface 114 of the encapsulating layer 112 diffuses into the insulating layer 106 of silicon dioxide to disadvantageously degrade the insulating property of the insulating layer 106. Nevertheless, use of copper metallization is desirable for further scaling down integrated circuit dimensions because of the lower bulk resistivity and the higher electromigration tolerance. Thus, a mechanism is desired for preventing the lateral drift of copper from the copper interconnect 102 along the bottom surface 114 of the encapsulating layer 112 into the insulating layer 106.

SUMMARY OF THE INVENTION

Accordingly, in a general aspect of the present invention, an additional encapsulating material is formed on the top surface of the interconnect to prevent lateral drift of conductive material from the interconnect to the surrounding insulating layer.

In one embodiment of the present invention, in a method for filling an interconnect opening to form an interconnect of an integrated circuit, the interconnect opening is formed within an insulating layer. The interconnect opening is partially filled with a conductive material to form a recess within the conductive material toward a top of the interconnect opening, and the recess is disposed within the interconnect opening. An alloy is conformally deposited to fill the recess. Any conductive material and the alloy on the insulating layer are polished away such that the conductive material and the alloy are contained within the interconnect opening.

A thermal anneal is then performed such that the conductive material and the alloy form into a conductive fill of a single grain structure within the interconnect opening. An additional encapsulating material is formed to cover a top surface of the conductive fill during the thermal anneal from the dopant of the alloy diffusing out of the alloy and along the top surface of the conductive fill. A bulk encapsulating layer is formed on top of the additional encapsulating material and on top of the insulating layer.

The dopant metal has a concentration in the alloy that is greater than the solid solubility of the dopant metal in the alloy. For example, the present invention may be used to particular advantage when the conductive material that partially fills the interconnect opening is copper, and when the alloy that fills the recess is a copper alloy with a dopant metal having a solid solubility in copper that is less than 0.1 atomic percent at room temperature. In that case, the dopant metal has a concentration in the copper alloy in a range of from about 0.2 atomic percent to about 5 atomic percent. The additional encapsulating material may be comprised of the dopant metal, or of an intermetallic compound formed from a reaction of the dopant metal with copper, or of a metal oxide formed from a reaction of the dopant metal with oxygen plasma.

In this manner, the additional encapsulating material on the top surface of the conductive fill prevents lateral drift of the conductive material comprising the conductive fill along a bottom surface of the bulk encapsulating layer and into the surrounding insulating layer to preserve the integrity of the surrounding insulating layer.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 1:
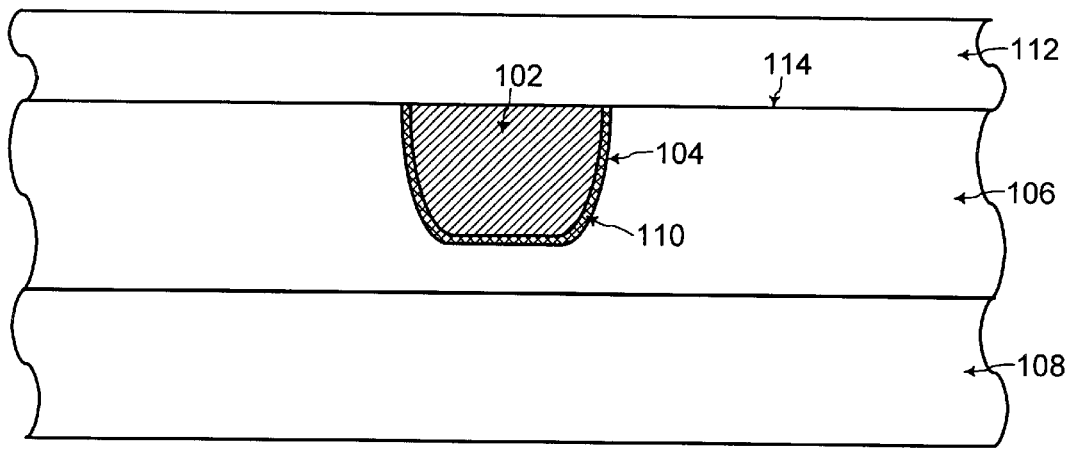
FIG. 1 shows a cross-sectional view of a copper interconnect formed by copper filling a trench within an insulating layer, according to the prior art.
Figure 2:
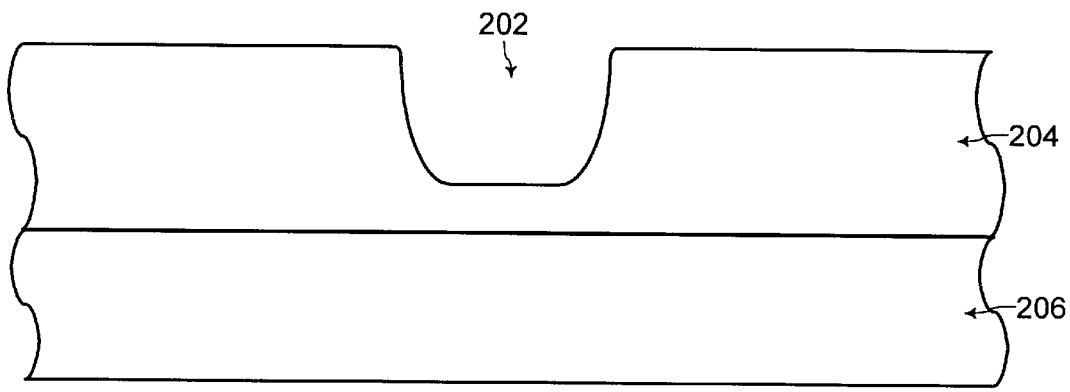
FIGS. 2, 3, 4, 5, 6, 7, 8, 9, and 10 illustrate process steps for forming an additional encapsulating material on the top surface of the conductive fill within an interconnect opening for preventing lateral drift of the material from the conductive fill along the bottom surface of a bulk encapsulating layer, according to an aspect of the present invention.

Referring to FIG. 2, for forming an interconnect such as copper interconnect, a trench 202 is formed within an insulating layer 204 on a semiconductor substrate 206 as part of an integrated circuit, as known to one of ordinary skill in the art of integrated circuit fabrication. Typically, the semiconductor wafer 206 is comprised of silicon (Si), and the insulating layer 204 is comprised of silicon dioxide ($SiO_2$) or a low dielectric constant insulating material such as organic doped silica, as known to one of ordinary skill in the art of integrated circuit fabrication.

Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization.

Thus, copper interconnect is typically formed by etching the trench 202 as an interconnect opening within the insulating layer 204. Referring to FIG. 2, the trench 202 is then filled with copper to form a copper interconnect, as known to one of ordinary skill in the art of integrated circuit fabrication. Processes for forming the trench 202 within the insulating layer 204 are known to one of ordinary skill in the art of integrated circuit fabrication.

Figure 3:
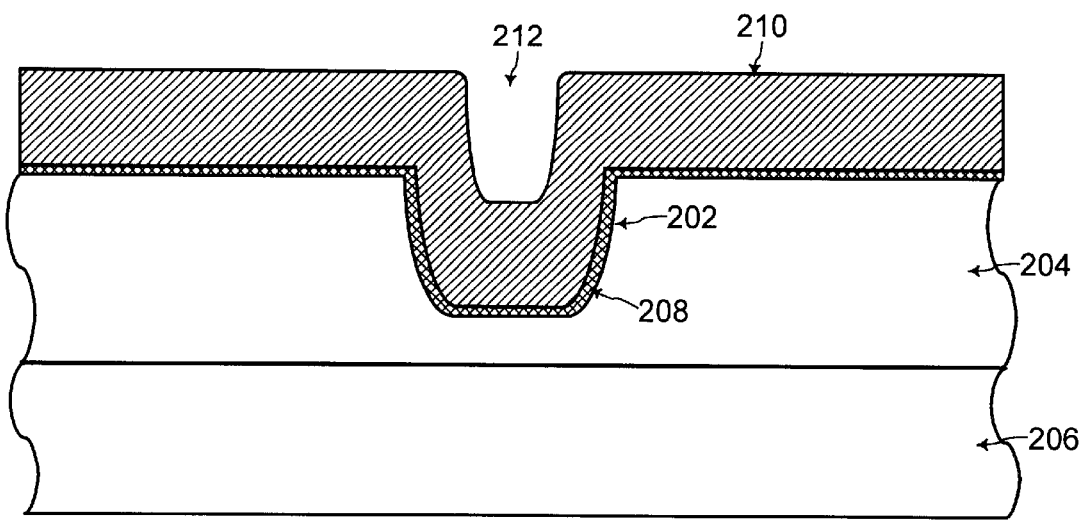

Referring to FIG. 3, typically before filling the trench 202 with copper to form the copper interconnect, a diffusion barrier material 208 is deposited on the sidewalls and the bottom wall of the trench 202 to prevent diffusion of copper from the copper interconnect into the surrounding insulating layer 204. Unfortunately, copper is a mid-bandgap impurity in silicon and silicon dioxide. Thus, copper may diffuse easily into these common integrated circuit materials. Referring to FIG. 3, the insulating layer 204 is typically comprised of silicon dioxide or a low dielectric constant insulating material such as organic doped silica, especially when the semiconductor substrate 206 is a silicon substrate.

Copper may easily diffuse into the insulating layer 204, and the diffusion of copper may degrade the performance of the integrated circuit. Thus, the diffusion barrier material 208 is deposited to surround the copper interconnect within the insulating layer 204, as known to one of ordinary skill in the art of integrated circuit fabrication. The diffusion barrier material 208 is disposed between the copper interconnect and the insulating layer 204 for preventing diffusion of copper from the copper interconnect to the insulating layer 204 to preserve the integrity of the insulating layer 204. Processes for deposition of the diffusion barrier material 208 are known to one of ordinary skill in the art of integrated circuit fabrication.

Further referring to FIG. 3, after deposition of the diffusion barrier material 208, a conductive material 210 such as copper is conformally deposited to partially fill the trench 202. The conductive material 210 may be conformally deposited by a CVD (chemical vapor deposition) process or an ECD (electrochemical plating deposition) process as known to one of ordinary skill in the art of the integrated circuit fabrication. If the ECD (electrochemical plating deposition) process is used, then a seed layer of copper is deposited such that the copper may be plated from such a seed layer.

Figure 4:
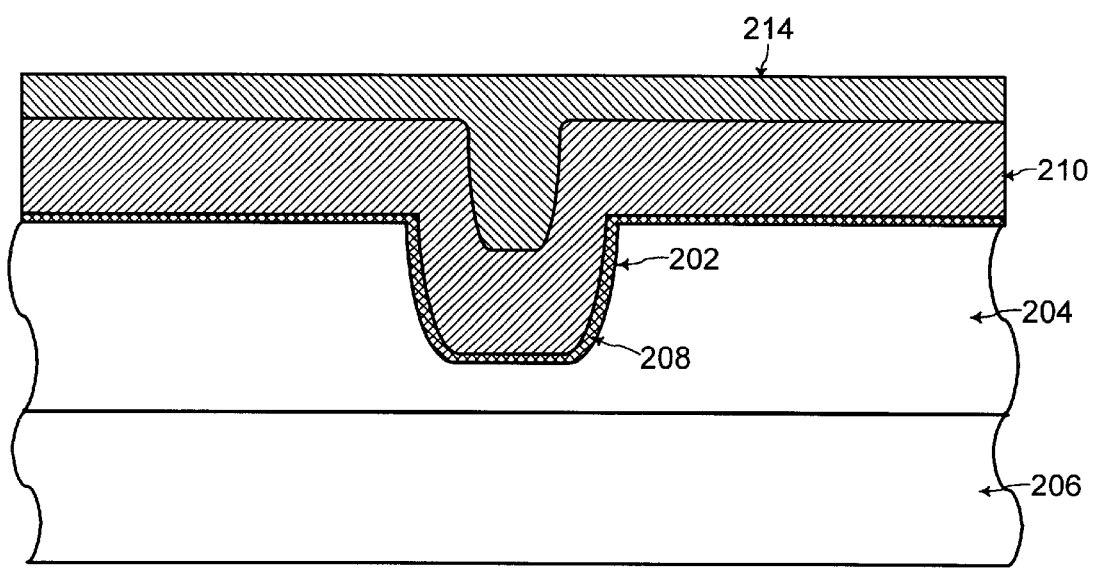

In any case, the conductive material 210 partially fills about 70% to about 90% of the volume of the trench 202 to form a recess 212 within the conductive material toward the top of the trench 202, and the recess 212 is disposed within the trench 202. Referring to FIGS. 3 and 4, when the conductive material 210 is copper, a copper alloy 214 is conformally deposited to fill the recess 212. The copper alloy is doped with a dopant metal having a relatively low solid solubility in copper (i.e., a solid solubility that is less than about 0.1 atomic percent in copper at room temperature). Examples of such dopant metal includes tantalum, indium, and zirconium. The dopant metal has a concentration in the copper alloy 214 that is higher than the solid solubility of the dopant metal (i.e., a concentration of the dopant metal in the copper alloy that is in a range of from about 0.2 atomic percent to about 5.0 atomic percent). Processes for conformal deposition of such an alloy 214 are known to one of ordinary skill in the art of integrated circuit fabrication.

Figure 5:
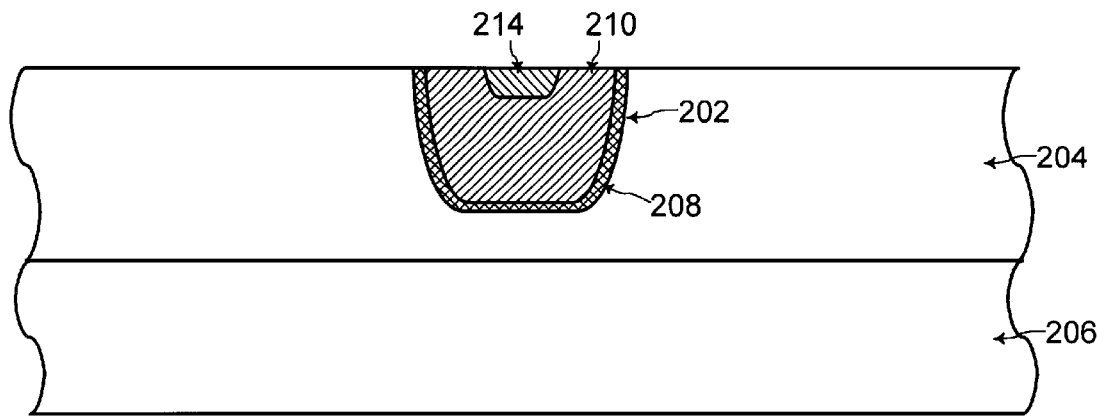

Referring to FIG. 4, because the conductive material 210 and the alloy 214 are deposited conformally, the conductive material 210 and the alloy 214 are also deposited on the insulating layer 204. Referring to FIG. 5, the conductive material 210 and the alloy 214 on the insulating layer 204 are polished away until the insulating layer 204 is exposed such that the conductive material 210 and the alloy 214 are contained within the trench 202. Processes, such as a CMP (Chemical Mechanical Polishing) process, for polishing away the conductive material 210 and the alloy 214 from the insulating layer 204 are known to one of ordinary skill in the art of integrated circuit fabrication.

In one embodiment of the present invention, a thermal anneal at a relatively low temperature (i.e. from about 100° Celsius to about 300° Celsius) for a relatively short time period (i.e., from about 30 seconds to about 60 minutes) may be performed before the process step of polishing the conductive material 210 and the alloy 214 from the insulating layer 204. A shorter anneal time is used for a higher anneal temperature. For example, when the anneal temperature is about 100° Celsius, the anneal time is about 60 minutes, and when the anneal temperature is about 300° Celsius, the anneal time is about 30 seconds. In addition, the anneal temperature and the anneal time depend on the dimensions of the interconnect with a lower anneal temperature and a longer anneal time being used for smaller dimensions of the interconnect.

Such a thermal anneal increases the densities of the conductive material 210 and the alloy 214 for more effective and uniform polishing of the conductive material 210 and the alloy 214 across the semiconductor substrate 206. However, the dopant metal substantially remains within the alloy 214 during this initial thermal anneal for increasing the densities of the conductive material 210 and the alloy 214.

Figure 6:
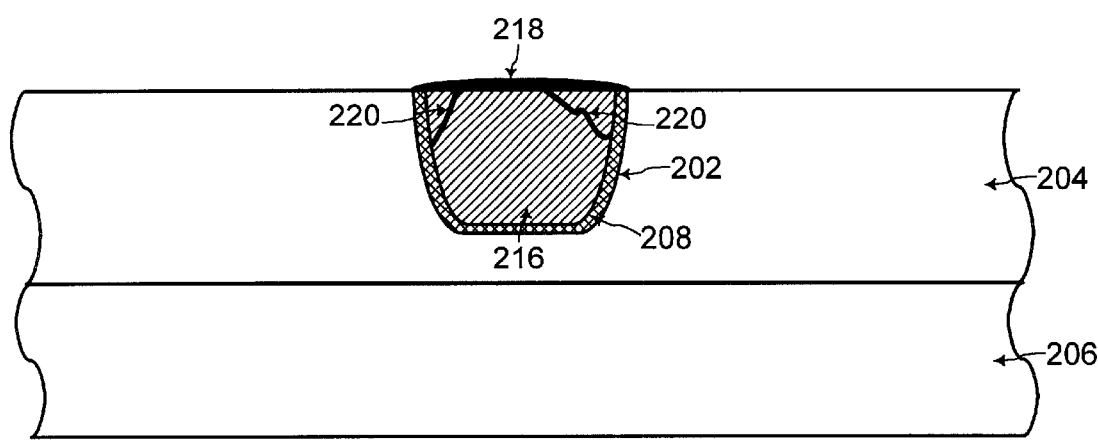

Referring to FIG. 5, the alloy 214 is exposed in the recess within the conductive material 210 toward the top of the trench 202. Referring to FIGS. 5 and 6, a thermal anneal is performed to anneal the alloy 214 and the conductive material 210 contained within the trench 202. In one embodiment of the present invention, the thermal anneal is performed at a temperature in a range of from about 250° Celsius to about 400° Celsius for a time period of from about 1 minute to about 60 minutes. A shorter anneal time is used for a higher anneal temperature. For example, when the anneal temperature is about 250° Celsius, the anneal time is about 60 minutes, and when the anneal temperature is about 400° Celsius, the anneal time is about 1 minute.

Referring to FIG. 6, during this thermal anneal, the alloy 214 and the conductive material 210 form into a conductive fill 216 of a single grain structure. Such a single grain structure is advantageous for minimizing resistance of the interconnect. In addition, during this thermal anneal, the alloy dopant within the alloy 214 diffuses out from the alloy 214 along the top surface of the conductive fill 216 to form an additional encapsulating material 218 that covers the top surface of the conductive fill 216.

Depending on the metal dopant of the alloy 214, the encapsulating material 218 may be comprised of the metal dopant or an intermetallic compound formed from a reaction of the metal dopant with the conductive material of the conductive fill 216. For example, when the metal dopant is tantalum within the copper alloy 214, then the additional encapsulating material 218 is comprised of tantalum that diffuses out of the alloy 214 to accumulate on the top surface of the conductive fill 216 during the thermal anneal. In that case, the additional encapsulating material 218 may also form along any grain boundaries (as shown by the lines 220 through the conductive fill 216 in FIG. 6) that may form through the conductive fill 216. Alternatively, when the metal dopant is indium or zirconium, then the additional encapsulating material 218 is comprised of an intermetallic compound formed from a reaction of the metal dopant with the copper of the conductive fill 216 during the thermal anneal.

Figure 7:
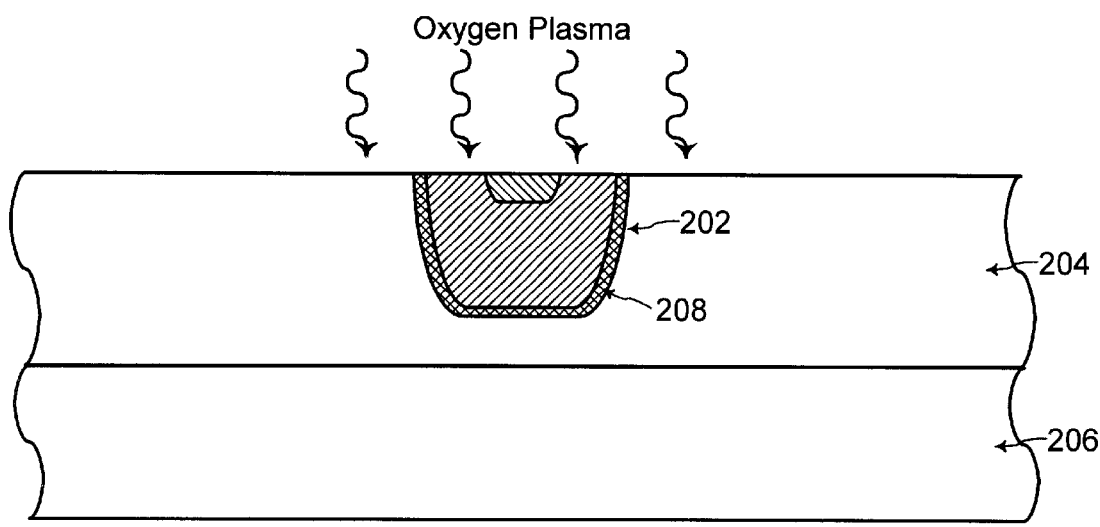
Figure 8:
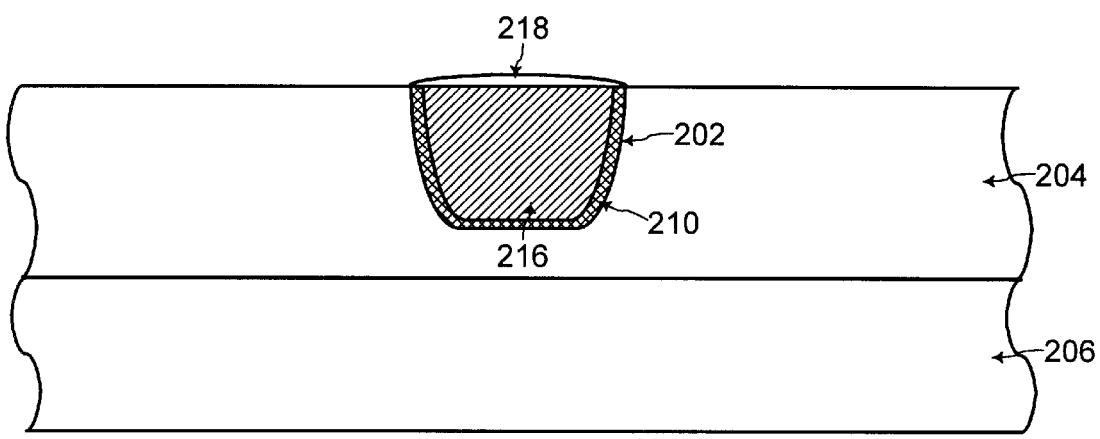

Referring to FIG. 7, in an alternative embodiment of the present invention, the top surface of the conductive material 210 and the alloy 214 is exposed to oxygen plasma during the thermal anneal for annealing the conductive material 210 and the alloy 214 when the metal dopant is amenable for forming a metal oxide. In that case, referring to FIG. 8, the additional encapsulating material 218 is comprised of a metal oxide formed from a reaction of the metal dopant that diffuses out of the alloy 214 with the oxygen plasma. Such a metal dopant that is amenable for forming metal oxide with the oxygen plasma includes indium and zirconium for example. Processes for generating oxygen plasma during the thermal anneal are known to one of ordinary skill in the art of integrated circuit fabrication.

Figure 9:
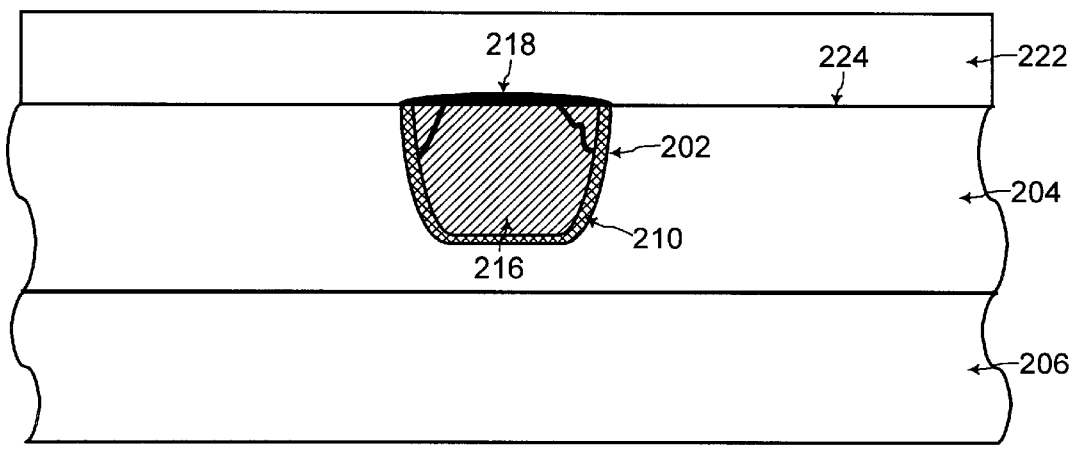
Figure 10:
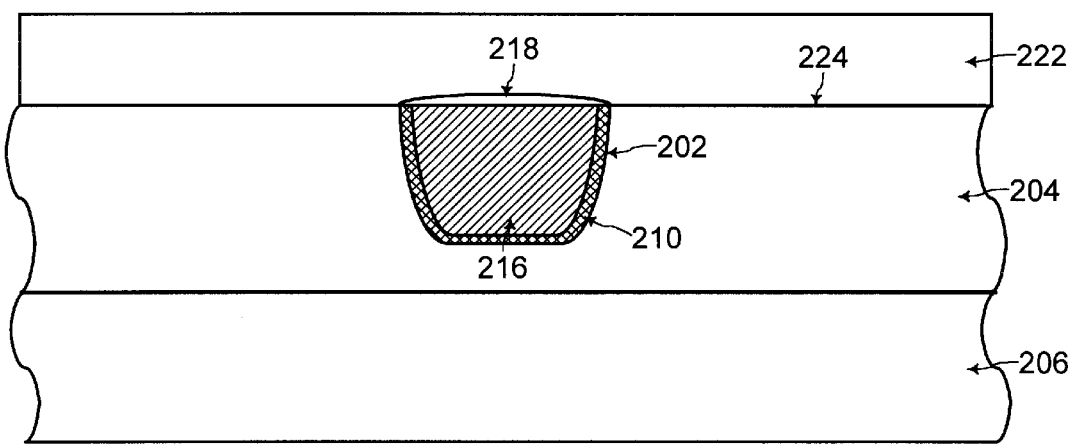

Referring to FIGS. 6 and 9, a bulk encapsulating layer 222 is deposited on top of the additional encapsulating material 218 and the insulating layer 204 when the additional encapsulating material 218 is comprised of the metal dopant or an intermetallic compound. Similarly, referring to FIGS. 8 and 10, the bulk encapsulating layer 222 is deposited on top of the additional encapsulating material 218 and the insulating layer 204 when the additional encapsulating material 218 is comprised of the metal oxide. The bulk encapsulating layer 222 may be comprised of one of silicon oxynitride (SiON), silicon nitride (SiN), and a silicon carbide (SiC) film doped with hydrogen, and copper does not easily diffuse through such an encapsulating layer 222. Processes for depositing such a bulk encapsulating layer 222 are known to one of ordinary skill in the art of integrated circuit fabrication.

In any case, in this manner, the additional encapsulating material 218 which covers the top surface of the conductive fill 216 prevents copper of the conductive fill 216 from laterally diffusing along the bottom surface 224 of the bulk encapsulating layer 222 and into the surrounding insulating layer 204. The additional encapsulating material 218 caps the conductive fill 216 such that the copper of the conductive fill 216 is contained within the trench 202. Minimization of drift of copper from the conductive fill 216 into the surrounding insulating layer 204 preserves the integrity of the surrounding insulating layer 204.

The foregoing is by way of example only and is not intended to be limiting. For example, the present invention may be used for effectively encapsulating any type of interconnect comprising a material that easily drifts laterally along the bottom of the encapsulating layer, aside from just the example of a copper interconnect, as would be apparent to one of ordinary skill in the art of integrated circuit fabrication from the description herein.

Furthermore, as will be understood by those skilled in the art, the structures described herein may be made or used in the same way regardless of their position and orientation. Accordingly, it is to be understood that terms and phrases such as "top," "bottom," "sidewalls," and "on" as used herein refer to relative location and orientation of various portions of the structures with respect to one another, and are not intended to suggest that any particular absolute orientation with respect to external objects is necessary or required. In addition, any materials mentioned herein are by way of example only.

The present invention is limited only as defined in the following claims and equivalents thereof.

We claim:

1. A method for filling an interconnect opening to form a interconnect of an integrated circuit, said interconnect opening being within an insulating layer, the method including the steps of:

A. partially filling said interconnect opening with a conductive material to form a recess within said conductive material toward a top of said interconnect opening, wherein said recess is disposed within said interconnect opening;

B. depositing an alloy to fill said recess on top of said conductive material partially filling said interconnect opening;

C. polishing away any conductive material and said alloy on said insulating layer such that said conductive material and said alloy are contained within said interconnect opening;

D. performing a thermal anneal after said step C such that said conductive material and said alloy form into a conductive fill of a single grain structure within said interconnect opening, wherein an additional encapsulating material is formed to cover a top surface of said conductive fill during said thermal anneal from said dopant of said alloy diffusing out of said alloy and along said top surface of said conductive fill; and E. forming a bulk encapsulating layer on top of said additional encapsulating material and on top of said insulating layer;

wherein said additional encapsulating material on said top surface of said conductive fill prevents lateral drift of said conductive material comprising said conductive fill along a bottom surface of said bulk encapsulating layer.

2. The method of claim 1, wherein said conductive material that partially fills said interconnect opening in said step A is copper, and wherein said alloy that fills said recess is a copper alloy with a dopant metal having a solid solubility in copper that is less than 0.1 atomic percent at room temperature.

3. The method of claim 2, wherein said dopant metal has a concentration in said copper alloy in a range of from about 0.2 atomic percent to about 5 atomic percent.

4. The method of claim 3, wherein said dopant metal is one of tantalum, indium, and zirconium.

5. The method of claim 2, wherein said additional encapsulating material is comprised of said dopant metal that covers said top surface of said conductive fill.

6. The method of claim 5, wherein said dopant metal is tantalum.

7. The method of claim 5, wherein said additional encapsulating material also forms along any grain boundaries of said conductive fill during said thermal anneal.

8. The method of claim 2, wherein said additional encapsulating material is an intermetallic compound formed from a reaction of said dopant metal with said copper during said thermal anneal.

9. The method of claim 8, wherein said dopant metal is one of indium and zirconium.

10. The method of claim 2, further including the step of:
exposing said top surface of said conductive fill to an oxygen plasma during said thermal anneal such that said additional encapsulating material is comprised of a metal oxide formed from a reaction of said oxygen plasma and said metal dopant during said thermal anneal.

11. The method of claim 10, wherein said dopant metal is one of indium and zirconium.

12. The method of claim 1, further including a step of:
depositing a diffusion barrier material on sidewalls and a bottom wall of said interconnect opening before said step A.

13. The method of claim 1, further including the step of:
performing an additional thermal anneal to increase the densities of said conductive material and said alloy before said step C of polishing away said conductive material and said alloy from said insulating layer.

14. The method of claim 13, wherein said additional thermal anneal is performed at a temperature in a range of from about 100° Celsius to about 300° Celsius for a time period in a range of from about 30 seconds to about 60 minutes.

15. The method of claim 1, wherein said bulk encapsulating layer is comprised of one of silicon oxynitride (SiON), silicon nitride (SiN), and a silicon carbide (SiC) film doped with hydrogen.

16. The method of claim 1, wherein said thermal anneal in said step D is performed at a temperature in a range of from about 250° Celsius to about 400° Celsius for a time period in a range of from about 1 minute to about 60 minutes.

17. A method for filling an interconnect opening to form an interconnect of an integrated circuit, said interconnect opening being within an insulating layer, the method including the steps of:

A. depositing a diffusion barrier material on sidewalls and a bottom wall of said interconnect opening;

B. partially filling said interconnect opening with copper to form a recess within said copper toward a top of said interconnect opening, wherein said recess is disposed within said interconnect opening;

C. conformally depositing a copper alloy to fill said recess on top of said conductive material partially filling said interconnect opening, wherein said copper alloy has a dopant metal having a solid solubility in copper that is less than 0.1 atomic percent at room temperature, and wherein said dopant metal has a concentration in said copper alloy in a range of from about 0.2 atomic percent to about 5.0 atomic percent;

D. performing a first thermal anneal at a temperature in a range of from about 100° Celsius to about 300° Celsius for a time period in a range of from about 30 seconds to about 60 minutes to increase the densities of said copper and said copper alloy;

E. polishing away any of said copper and said copper alloy on said insulating layer such that said copper and said copper alloy are contained within said interconnect opening;

F. performing a second thermal anneal after said step H at a temperature in a range of from about 250° Celsius to about 400° Celsius for a time period in a range of from about 1 minute to about 60 minutes such that said copper and said copper alloy from into a conductive fill of a single grain structure within said interconnect opening, wherein an additional encapsulating material of said metal dopant is formed to cover a top surface of said conductive fill during said second thermal anneal from said metal dopant of said copper alloy diffusing out of said copper alloy and along said top surface of said conductive fill, and wherein said additional encapsulating material also forms along any grain boundaries of said conductive fill during said second thermal anneal; and G. forming a bulk encapsulating layer on top of said additional encapsulating material and on top of said insulating layer, wherein said bulk encapsulating, layer is comprised of one of silicon oxynitride (SiON), silicon nitride (SiN), and a silicon carbide (SiC) film doped with hydrogen;

and wherein said additional encapsulating material on said top surface or said conductive fill prevents lateral drift of said copper comprising said conductive fill alonlg a bottom surface of said bulk encapsulating layer.

* * * * *